(12) United States Patent
Kimoto et al.

(10) Patent No.: US 6,847,221 B2
(45) Date of Patent: Jan. 25, 2005

(54) PROBE PIN ASSEMBLY

(75) Inventors: Gunsei Kimoto, 1-3-2-807, Daiba, Minato-ku, Tokyo (JP); Shinkichi Takai, Musashino (JP)

(73) Assignee: Gunsei Kimoto, Tokyo (JP)

( * ) Notice: Subject to any disclaimer, the term of this patent is extended or adjusted under 35 U.S.C. 154(b) by 42 days.

(21) Appl. No.: 10/112,109

(22) Filed: Mar. 28, 2002

(65) Prior Publication Data

US 2002/0155736 A1 Oct. 24, 2002

(30) Foreign Application Priority Data

Mar. 29, 2001 (JP) ........................................ 2001-137926

(51) Int. Cl.$^7$ .............................................. G01R 1/073
(52) U.S. Cl. ........................ 324/762; 324/754; 324/761
(58) Field of Search ................................ 324/762, 761, 324/754

(56) References Cited

U.S. PATENT DOCUMENTS

| | | | |
|---|---|---|---|
| 4,898,539 A | 2/1990 | Glover et al. | |
| 5,545,045 A | 8/1996 | Wakamatsu | |
| 5,864,946 A | * 2/1999 | Eldridge et al. | ............... 29/843 |
| 5,923,178 A | * 7/1999 | Higgins et al. | ............. 324/754 |
| 5,952,843 A | * 9/1999 | Vinh | ........................... 324/761 |
| 5,955,888 A | * 9/1999 | Frederickson et al. | ...... 324/761 |
| 6,150,830 A | * 11/2000 | Schmid et al. | .............. 324/761 |
| 6,426,638 B1 | * 7/2002 | Di Stefano | ................. 324/754 |

* cited by examiner

*Primary Examiner*—Ernest Karlsen
(74) *Attorney, Agent, or Firm*—Haynes and Boone, LLP (57) ABSTRACT

A prove pin assembly is provided in which the probe pins for a chip under test occupy the only space above the chip, not extending into the space above the adjacent chip. The probe pin assembly has a lateral array of parallel probe pins of a plurality of first perpendicular-type probe pins and a vertical array of parallel probe pins of a plurality of second perpendicular-type probe pins, wherein said lateral array of parallel probe pins and vertical array of parallel probe pins occupy different spaces for deformation above the region of the chip under test and fit in the limited planar range corresponding to the chip.

15 Claims, 12 Drawing Sheets

PROBE PIN ASSEMBLY

BACKGROUND OF THE INVENTION

1. Field of the Invention

This invention relates to probe pin assemblies for use in the electric measurement of semiconductor integrated circuit chips and liquid crystal devices, more specifically, to a probe pin assembly for use in testing integrated circuits on a wafer.

2. Description of Prior Art

Conventionally, the electric properties of a chip such as an IC chip and LSI chip are measured by contacting probe pins to the chip terminals for electric continuity. Cantilever type probe pins and perpendicularly movable pins are typical examples. In the cantilever type probe pin assembly, the probe pins are arrayed horizontally over the substrate and the pin ends are connected to the circuit pattern on a substrate. In the perpendicularly movable probe pin assembly, the probe pins are mounted vertically on the substrate and their output ends are connected to the circuit pattern on the substrate. Both types of pin probe assemblies adopt the beam structure to provide a contact pressure between the input unit and the terminals of the chip under test.

Figure 1:
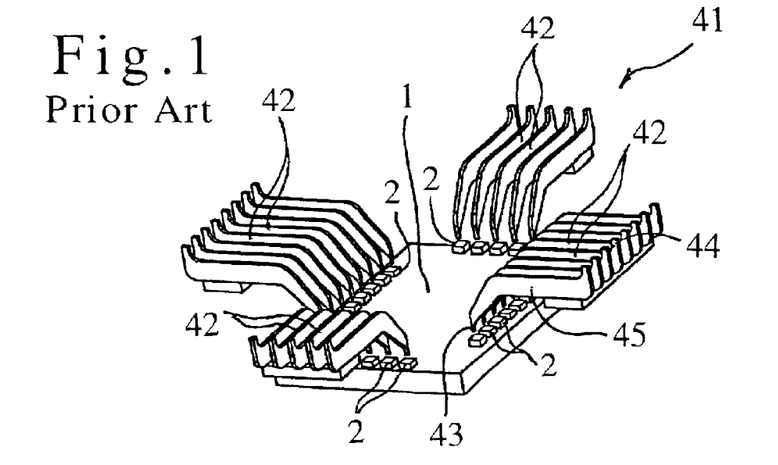
FIG. 1 is a perspective view of a prior art probe pin assembly.
Figure 2:
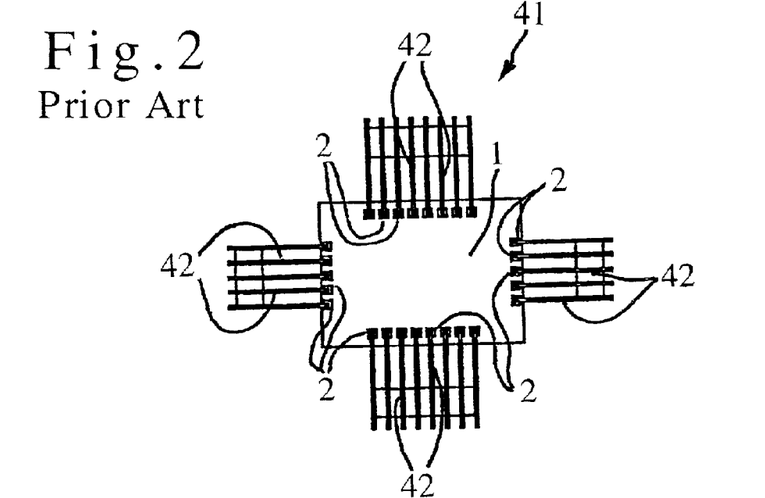
FIG. 2 is a plan view of the prior art probe pin assembly.
Figure 3:
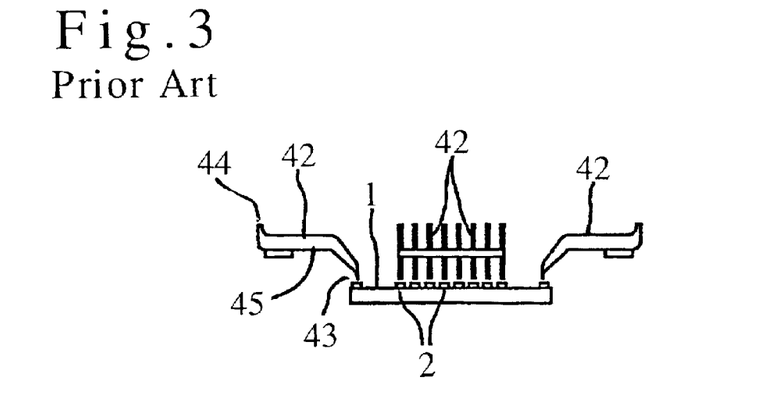
FIG. 3 is a front view of the prior art probe pin assembly.
Figure 26:
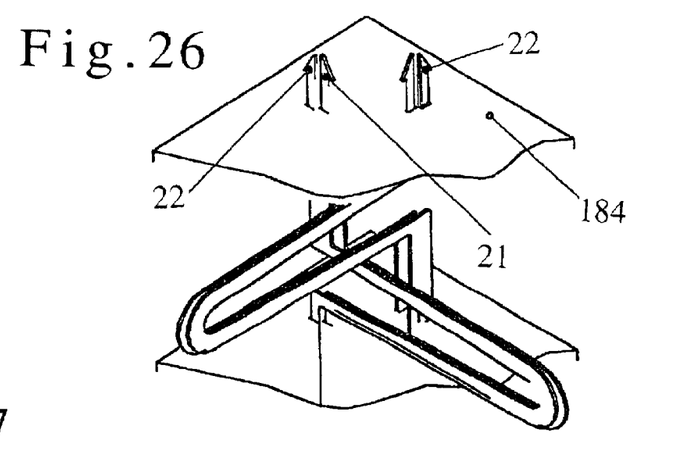
FIG. 26 is a perspective view illustrating the structure of the intersection of the perpendicular-type probe pins of the second embodiment.
Figure 27:
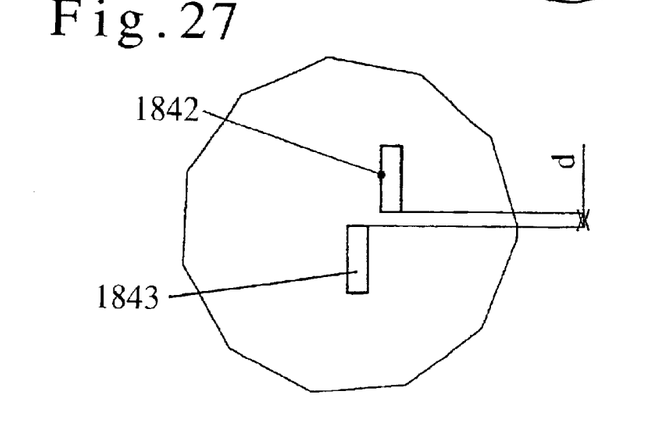
FIG. 27 is a plan view of the guide holes in the guide used in the perpendicular-type probe pin of the second embodiment.

FIGS. 1–3 show examples of such probe pin assemblies. Referring to FIGS. 1, 26 and 27, a rectangular LSI chip 1 is exemplified as the chip 1 under test. The LSI chip 1 has electrode pads 2 in one or more than one line on its peripheral areas. For simplicity of drawing, the figures show only one line of electrode pads: five pads in the vertical direction and eight pads in the lateral direction.

Referring now to FIG. 1, the probe pin assembly 41 has a plurality of probe pins 42. Each probe pin 42 is a cantilever type pin, having an input unit 43 in one end, an output unit 44 in the other end and a deformation unit 45 of the cantilever structure between the input unit and output unit. The probe pins 42 are arrayed in accordance with the array of the electrode pads 2 of the LSI chip 1 around its peripheral areas. The probe pins are mounted on a substrate (not shown), and the output unit 44 is connected to a circuit pattern of the substrate.

The LSI chip 1 is mounted on an inspection bed (not shown) when the LSI chip 1 is tested or inspected. The LSI chip 1 is placed on the inspection bed in the form of a wafer that has not been diced into individual LSI chips. As the inspection bed is moved upward, the input unit 43 of each probe pin 42 resiliently contacts each electrode pad 2 of the LSI chip 1. Electric continuity is thereby established between the input unit 43 of the probe pin 42 and the electrode pad 2, and then the electric properties are measured.

The prior art probe pin assembly, however, has a problem that the probe pins do not reach all the electrode pads of the LSI chips together when a number of chips are arranged close to each other on a wafer as is the case where a plurality of LSI chips are arranged in a grid pattern on the wafer. This is because the probe pins of a predetermined length are arranged over each chip under test to occupy its peripheral spaces.

Moreover, as the IC manufacturing technology is improved these years, the circuit pattern has become extremely fine and the required pin pitch of probe pins used in IC testing has also become very small. As connectors that couple electronic devices together are also downsized, the terminal pitch thereof is required to be small as well. Then it becomes difficult to provide a probe pin having an appropriate spring constant because the probe pin is not allowed to have a sufficient space needed for the installation of its deformation unit. If the elastic deformation of a probe pin and its movable margin become small, an appropriate contact pressure is not provided between the probe pin and the electrode pad when there is, for example, a pin manufacturing error or a mechanical pin positioning error during contact.

SUMMARY OF THE INVENTION

To solve the above problem, the probe pin assembly according to the present invention comprises a lateral array of parallel probe pins where a plurality of first perpendicular-type probe pins are arrayed in a lateral direction to contact a plurality of electrode pads arranged in a vicinity of a lateral edge of a chip under test, each pin having an input unit on one end for contacting the electrode pad of the chip, an output unit on the other end for contacting a circuit terminal, and a deformation unit of a beam structure between the input unit and the output unit, the deformation unit being located rather on either side of the input and output units, and a vertical array of parallel probe pins where a plurality of second perpendicular-type probe pins are arrayed in a vertical direction to contact a plurality of electrode pads arranged in a vicinity of a vertical edge of the chip under test, each pin having an input unit on one end for contacting the electrode pad of the chip, an output unit on the other end for contacting a circuit terminal, and a deformation unit of a beam structure between the input unit and the output unit, the deformation unit being located rather on either side of the input and output units, wherein said lateral array of parallel probe pins and vertical array of parallel probe pins occupy different spaces for deformation above a region of the chip under test and all fit in a limited planar range corresponding to said chip.

The probe pin assembly according to the present invention is embodied as follows. First, the input unit and the output unit of the first and second perpendicular-type probe pins are almost aligned on a common perpendicular line, while the deformation unit is formed into a curve between the input unit and output unit.

Second, each probe pin is composed of a pair of outer and inner probe pins to correspond to the electrode pads arranged in a staggered pattern.

Third, the probe pin assembly further comprises at least one guide for guiding the perpendicular-type probe pins to the electrode pad of the chip under test and the circuit terminals, the guides being installed between the input unit and deformation unit and between the output unit and deformation unit.

Fourth, the guide has an almost rectangular hole having at least one notch for guiding the perpendicular-type probe pin.

Fifth, the guide is made of a thin, flexible film or sheet.

Sixth, the guide has a multi-layered structure.

Seventh, the probe pin assembly further comprises means for holding a plurality of guides in parallel.

Eighth, the means for holding the guides in parallel is a frame having a hollow thereinside.

Ninth, the probe pin assembly further comprises means for restricting vertical movement of the guides and an upper lid and a lower lid for restricting lateral movement of the guides.

Tenth, either upper or lower lid is coupled with a substrate that does not move.

Thanks to the above structure, since the deformation units of the lateral parallel pin array and those of the vertical parallel pin array are arranged at different heights, the perpendicular-type probe pins of the lateral parallel pin array do not interfere with those of the vertical parallel pin array on the same plane over the chip under test. Thus the probe pins for each chip under test can be accommodated in the space just above each chip so that they do not extend to the adjacent space above another chip, thereby making multi-die contact or batch-die contact possible. Moreover, since each probe pin has a sufficient space above the chip under test for deformation, it becomes possible to prevent the contact error and positioning error during contact of the pin from exceeding tolerance.

According to the present invention, since the vertical-type probe pins occupy only the space above each chip under test and they do not extend to the adjacent space above another chip, thereby making multi-die contact or batch-die contact possible. Moreover, since each vertical-type probe pin has a sufficient space above the chip under test for deformation, it becomes possible to prevent the contact error and positioning error during contact of the pin from exceeding tolerance.

It is, therefore, an object of the present invention to provide a probe pin assembly that limits the space occupied by the probe pins for each chip under test to the space just above each chip so as not to extend to the adjacent space above another chip, when measuring the electric properties of a chip by establishing electric continuity by contacting probe pins to the electrode pads of the chip. Then multi-die contact or batch-die contact becomes possible to do.

Another object of the present invention is to provide a probe pin assembly that provides a sufficient space above the chip under test for the deformation of each probe pin and thereby prevent the contact error and positioning error during contact of the pin from exceeding tolerance.

The foregoing objects and advantages of the invention will be apparent from the following, more particular, description of the preferred embodiments of the invention, as illustrated in the accompanying drawing.

DESCRIPTION OF THE PREFERRED EMBODIMENTS (Embodiment 1)

Figure 4:
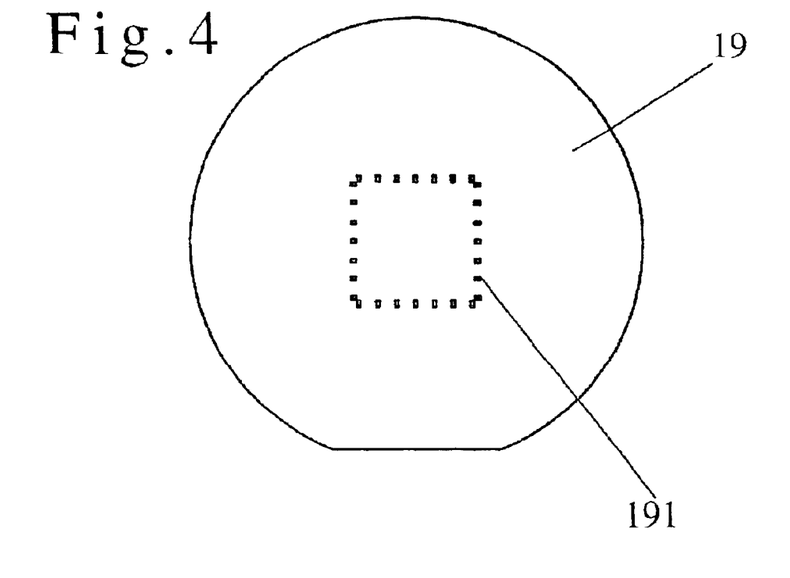
FIG. 4 is a plan view illustrating an arrangement of electrode pads on a wafer used in a first embodiment.
Figure 5:
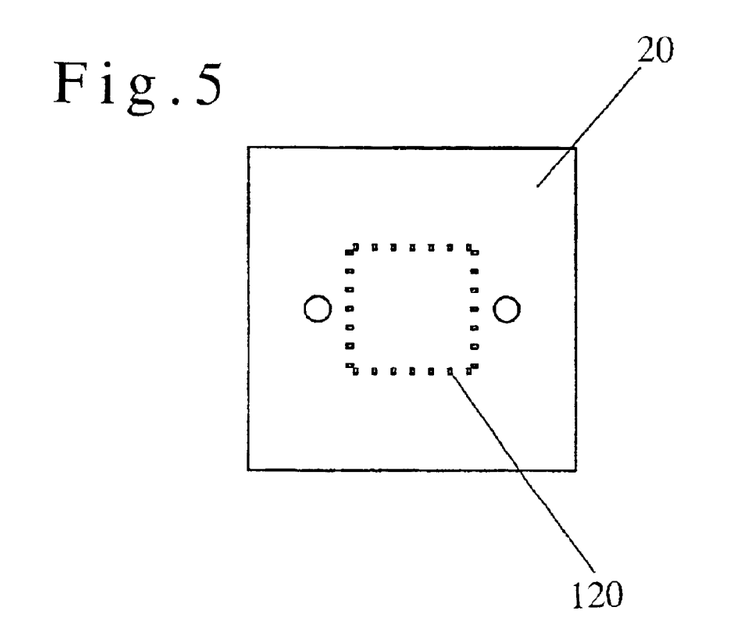
FIG. 5 is a plan view illustrating an arrangement of electrode pads of a circuit in the first embodiment.
Figure 6:
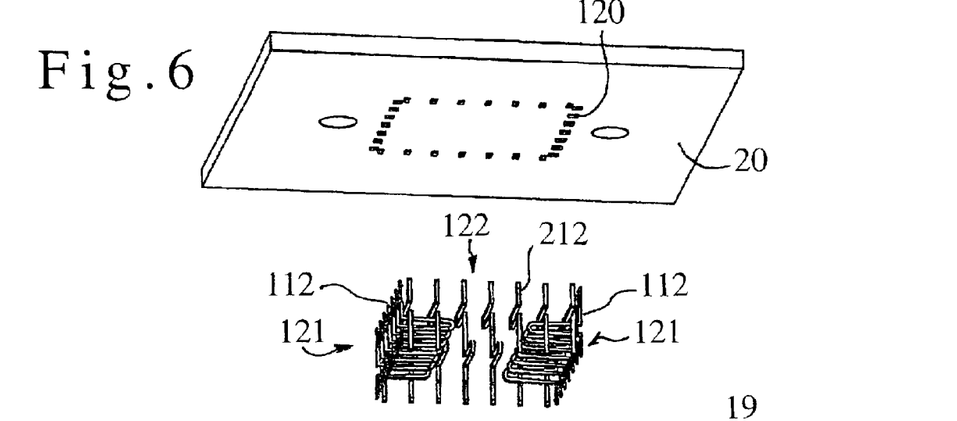
FIG. 6 is a perspective view of a probe pin assembly of the first embodiment.

FIGS. 4–21 illustrate a first embodiment of the present invention. FIG. 4 shows an array of electrode pads on a wafer, while FIG. 5 shows an array of electrode pads on a circuit. Referring now to FIG. 4, electrode pads 191 are arrayed on a wafer 19 in one rectangular line. There are some regions in the four corners where electrode pads are absent. As shown in FIG. 5, electrode pads 120 are arrayed on a rectangular line on a circuit board 20. The electrode pads 191 for a single chip on the wafer 19 are located so that they face those of the electrode pads 120 on the circuit board 20 when they are opposed to each other. The first embodiment will describe a probe pin assembly that is suitable for use in establishing electric connection or electric continuity between such opposing electrode pads. Referring now to FIG. 6, the probe pin assembly has a lateral array of parallel probe pins 121 having a plurality of first perpendicular-type probe pins 112 and a vertical array of parallel probe pins 122 having a plurality of second perpendicular-type probe pins 212, as major constituting elements. The lateral array of parallel probe pins 121 and the vertical array of parallel probe pins 122 are laid in different directions, crossing each other on the same plane. The perpendicular-type probe pins 112 of the lateral array of parallel probe pins 121 and the perpendicular-type probe pins 212 of the vertical array of parallel probe pins 122 are assembled to each occupy different (in the vertical direction) spaces for deformation. Thus they do not interfere with each other, and the ends are located on the same plane.

Figure 7:
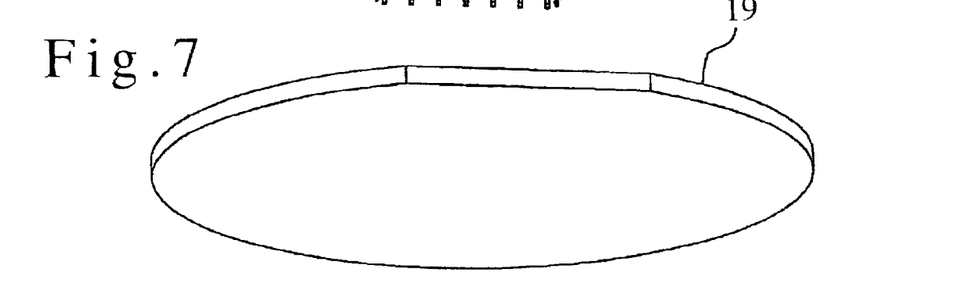
FIG. 7 is a perspective view of a perpendicular-type probe pin used in the probe pin assembly of the first embodiment.

The first perpendicular-type probe pin 112 is made of a conductive material, and as shown in FIG. 7, it has an input unit 13 on an end that will contact an electrode pad of the chip under test and an output unit 14 on the other end that will contact a terminal of a circuit. A deformation unit 15 of a beam structure is formed between the input unit 13 and the output unit 14, located rather on the side of the output unit 14. Much like, the second perpendicular-type probe pin 212, made of a conductive material, has an input unit 13 on one end that will contact an electrode pad of the chip under test and an output unit 14 on the other end that will contact a terminal of a circuit. A deformation unit 15 of a beam structure is formed between the input unit 13 and the output unit 14, located rather on the side of the input unit 13. Either face or both faces of the perpendicular-type probe pins 112 and 212 have an insulator coating except for the input unit 13 and the output unit 14. The input unit 13 and output unit 14 may have any desired shapes and properties. The deformation unit 15 made into a curve protrudes from the vertical line between the input unit 13 and the output unit 14. Since the deformation unit 15 has a beam structure installed off the vertical line between the input unit 13 and the output unit 14, its elastic deformation provides an appropriate contact pressure between the input unit 13 and the electrode pad. The depicted perpendicular-type probe pin 112 (212) has a segment of a circle in the deformation unit 15. The shape of the deformation unit 15, however, may have any other desired shapes. When the shape of the deformation unit 15 is changed, there will be some options, for example, to locate the deformation unit 15 off the line connecting the input unit 13 and the output unit 14, change the curvature and move the point of force application, for ensuring the electric contact. However, there is no change in the key effect that the deformation unit 15 of the probe pin is located away from the point of force application.

Figure 8:
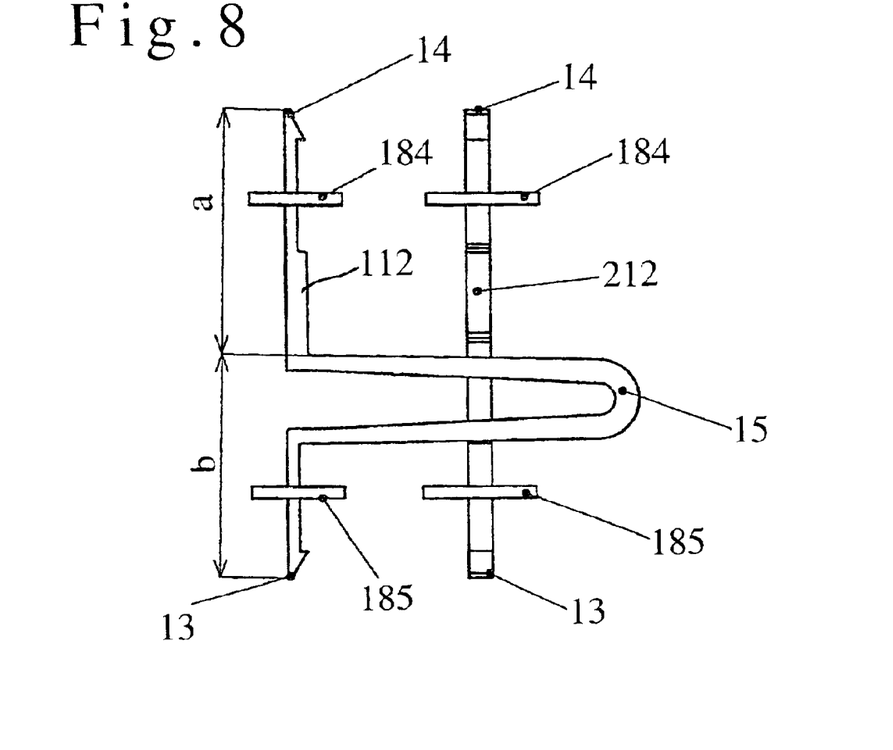
FIG. 8 is a front view of the perpendicular-type probe pin used in the probe pin assembly of the first embodiment.
Figure 9:
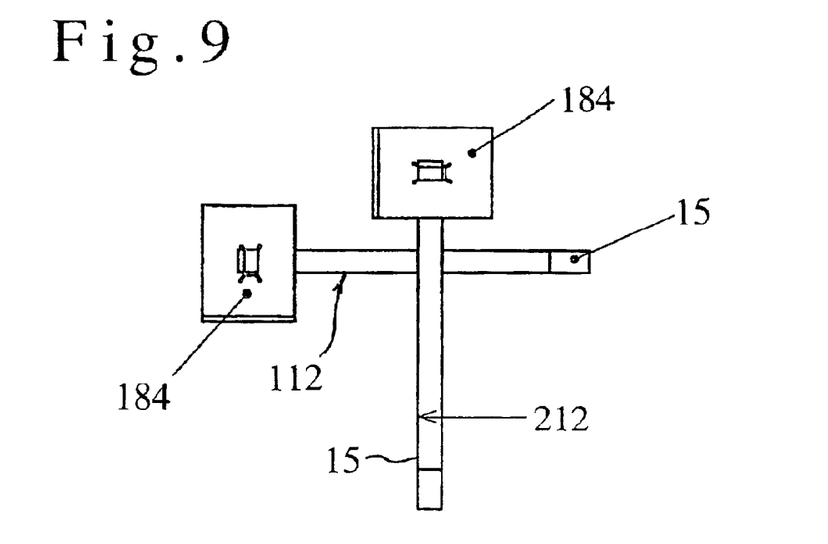
FIG. 9 is a plan view of the perpendicular-type probe pin used in the probe pin assembly of the first embodiment.
Figure 10:
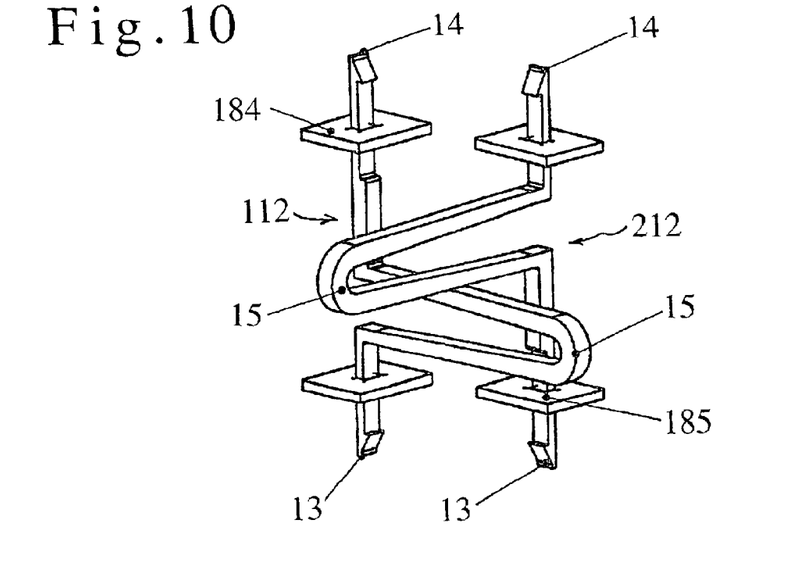
FIG. 10 is a perspective view of the perpendicular-type probe pin used in the probe pin assembly of the first embodiment.

In the case of the first perpendicular-type probe pin 112, as shown in FIG. 8, a is larger than b, where a is the vertical distance between the output unit 14 and the end of the deformation unit 15 while b is the distance between the input unit 13 to the same end of the deformation unit 15. As shown in FIG. 8, in the case of the second perpendicular-type probe pin 212, a is smaller than b, where a is the vertical distance between the output unit 14 and the end of the deformation unit 15 while b is the distance between the input unit 13 to the same end of the deformation unit 15. Then as shown in FIG. 9, when the first perpendicular-type probe pin 112 and the second perpendicular-type probe pins 212 are located, with their deformation units 15 being across at right angles and directed inward, they do not interfere with each other as shown in FIG. 10. The lateral array of parallel probe pins 121 and the vertical array of parallel probe pins 122 are thereby allowed to cross each other at right angles for installation. For simplicity of explanation, the above case exemplified two probe pins 112 and 212 located to cross each other at right angles. However, as far as the above relations for a and b are satisfied, the shapes of the input unit 13, output unit 14 and deformation unit 15 as well as the crossing angles (90 degrees in the above example) may be other than those adopted here.

Figure 11:
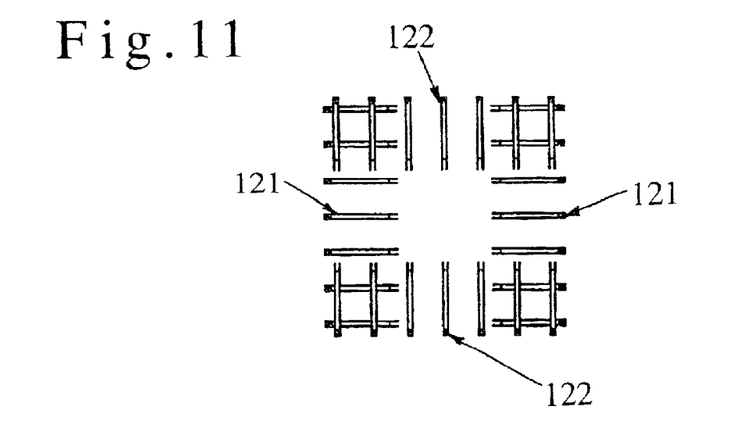
FIG. 11 is a plan view of a lateral array of parallel probe pins and a vertical array of parallel probe pins in the probe pin assembly of the first embodiment.
Figure 12:
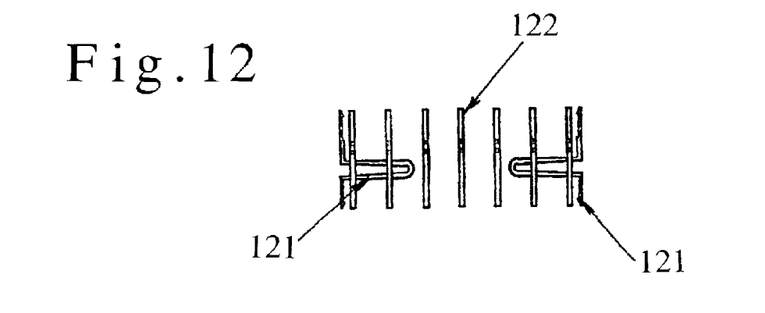
FIG. 12 is a front view of the lateral array of parallel probe pins and the vertical array of parallel probe pins in the probe pin assembly of the first embodiment.
Figure 13:
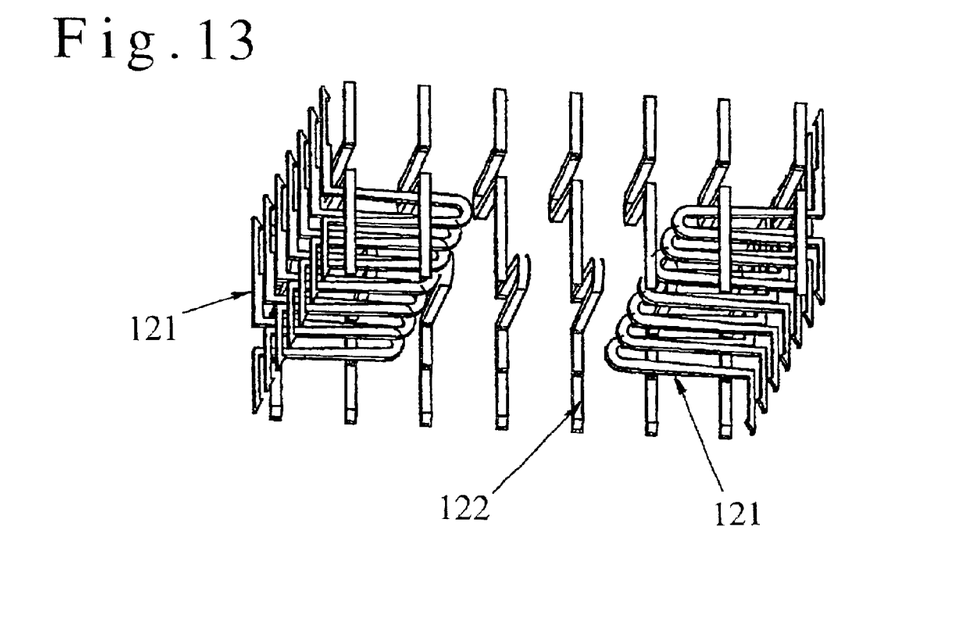
FIG. 13 is a perspective view of the lateral array of parallel probe pins and the vertical array of parallel probe pins in the probe pin assembly of the first embodiment.

Referring now to FIGS. 11, 12 and 13, in the lateral array of parallel probe pins 121, a plurality of first perpendicular-type probe pins 112 are closely arranged on the right and left sides each in a line with their deformation units 15 being directed inward so that their input units 13 and output units 14 are each opposed to the corresponding electrode pads of the circuit and the electrode pads of the chip under test. In a similar manner, in the vertical array of parallel probe pins 122, a plurality of second perpendicular-type probe pins 212 are closely arranged on the front and back sides each in a line with their deformation units 15 being directed inward so that their input units 13 and output units 14 are each opposed to the corresponding electrode pads. This configuration makes it possible to locate the lateral array of parallel probe pins 121 and vertical array of parallel probe pins 122 in the limited space above the region surrounded by electrode pads, namely, the region corresponding to the LSI chip of which electric continuity is to be taken. Then electric contacts are provided for a plurality of LSI all together.

Figure 14:
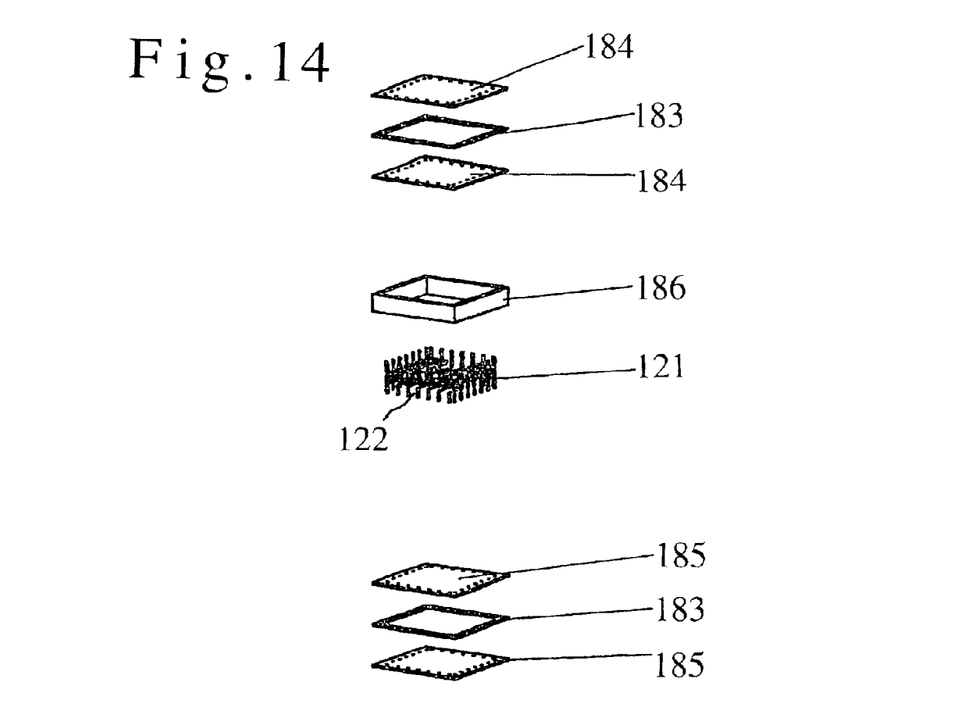
FIG. 14 is a perspective view of the probe pin assembly of the first embodiment and disassembled guide, spacer and frame that are to be installed in this probe pin assembly.
Figure 15:
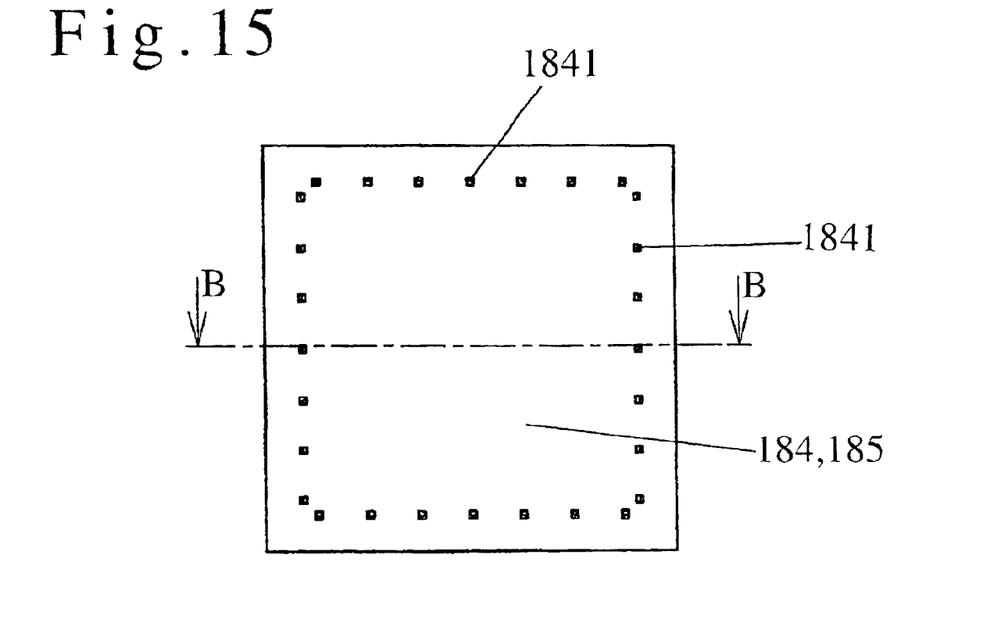
FIG. 15 is a plan view of the guide that is to be installed in this probe pin assembly of the first embodiment.
Figure 16:
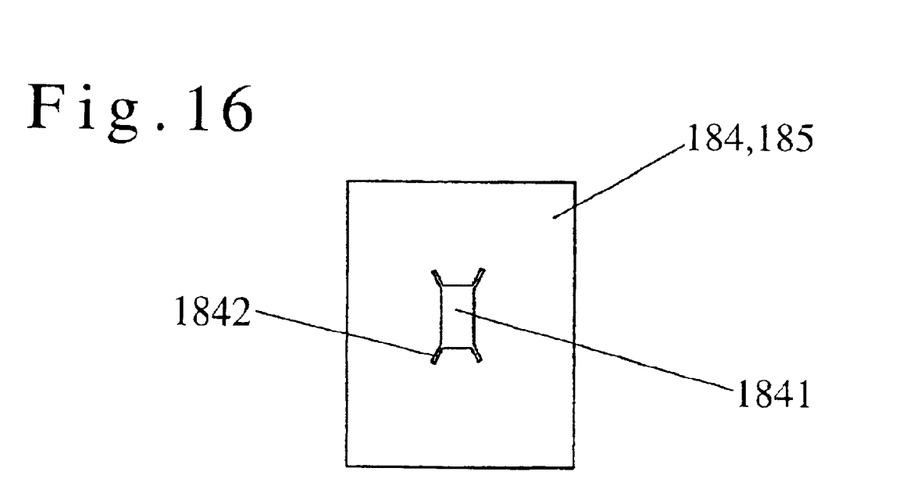
FIG. 16 is a plan view of a guide hole in the guide of the first embodiment.

To the lateral array of parallel probe pins 121 and vertical array of parallel probe pins 122 of such a configuration, as shown in FIG. 14, an output side guide 184 that guides the output unit 14 to the circuit terminals and is located between the output unit 14 and deformation unit 15 of the perpendicular-type probe pins 112 (212) is attached along with an input side guide 185 that guides the input unit 13 to the electrode pads of the chip under test and is located between the input unit 13 and deformation unit 15 of the perpendicular-type probe pins 112 (212). These guides 184 and 185 are composed of a pair of guide components. Each guide component made of a dielectric material is formed into a thin flexible film or sheet, and as shown in FIG. 15, it has guide holes 1841 in positions where the input unit 13 and output unit 14 penetrate. The guide holes 1841 are formed into an almost rectangular shape so as to guide the input units 13 and output units 14 of the first and second perpendicular-type probe pins 112, 212. As shown in FIG. 16, this guide hole 1841 has notches in the four corners to make it easy to accept the input unit 13 and output unit 14 of the perpendicular-type probe pins 112, 212. For example, when the input unit 13 or output unit 14 of a perpendicular-type probe pin is inserted in the hole 1841 slightly off-centered, the input side guide 185 or output side guide 184 deforms on the side opposed to the probe pin. Then the hole 1842 works like a larger hole. After insertion, due to the resilient repulsion of the material used in the input side guide 185 and output side guide 184, the perpendicular-type probe pin 121 (212) is automatically centered in the guide hole 1841. Since the guide hole 1841 has such a high pin centering capability, the perpendicular-type probe pin can be easily received in the hole, and eventually the perpendicular-type probe pins can be assembled with high precision.

Figure 17:
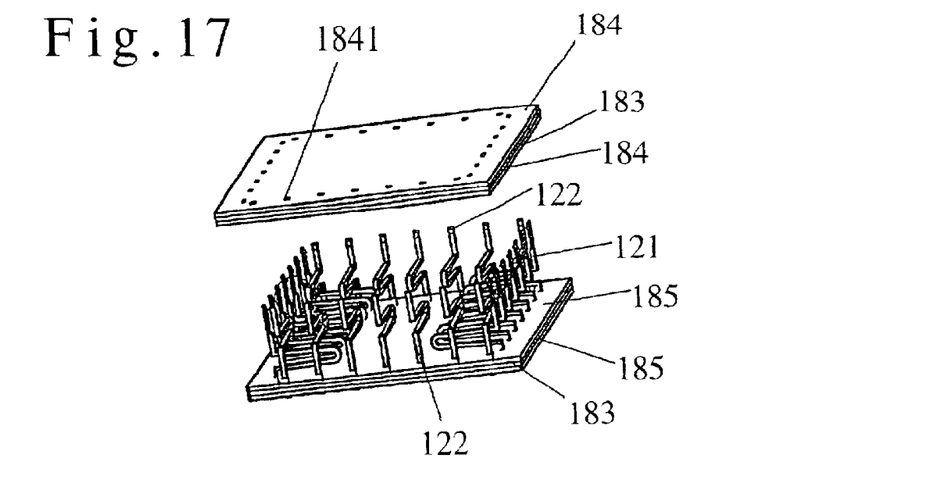
FIG. 17 is a perspective view of the probe pin assembly of the first embodiment and the guide and spacer that are to be installed in this probe pin assembly.
Figure 18:
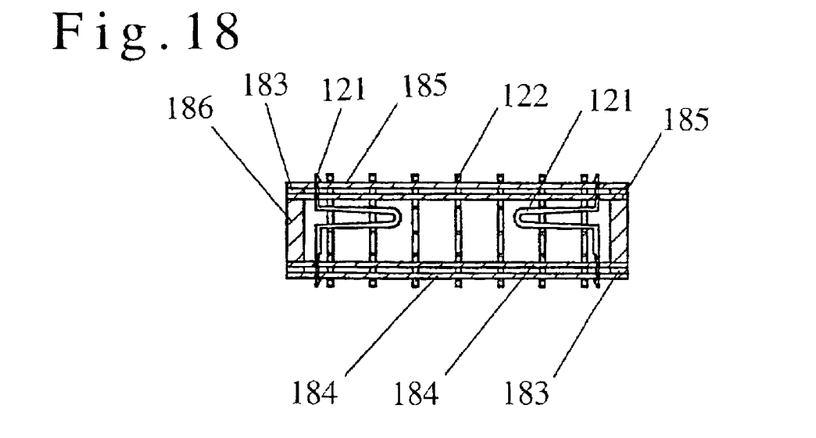
FIG. 18 is a sectional view of the probe pin assembly of the first embodiment, guide, spacer and frame that are to be installed in this probe pin assembly.

The input side guide 185 and output side guide 184 are each formed with a pair of guide components, as shown in FIG. 14, to sandwich a spacer 183. The spacer 183 is a frame having the same external dimensions as the guide component, formed to overlap the periphery of the guide component beyond the guide holes 1841 when laminated between the two guide components with an adhesive or the likes. In the first embodiment, the input side guide 185, output side guide 184 and spacer 183 are assembled with an adhesive and the likes for easy assembly. However, it is not always necessary to fasten them with adhesives. The spacer 183 may be absent if only one input side guide 185 is used above the pins and only one output side guide 184 is used below the pins. Meanwhile, the input side guide 185 and the output side guide 184 may be multi-layered using a plurality of spacers 183. Between the upper and lower guides 184, 185, a frame 186 is inserted that is made hollow not to block the perpendicular-type probe pins 112, 212. This frame 186 holds the upper and lower guides 184, 185 in parallel. As shown in FIG. 17, the perpendicular-type probe pins of the lateral array of parallel probe pins 121 and vertical array of parallel probe pins 122 are inserted into the guide holes 1841 of the upper and lower guides 184, 185 to form a primary probe pin assembly 18 as shown in FIG. 18.

Figure 19:
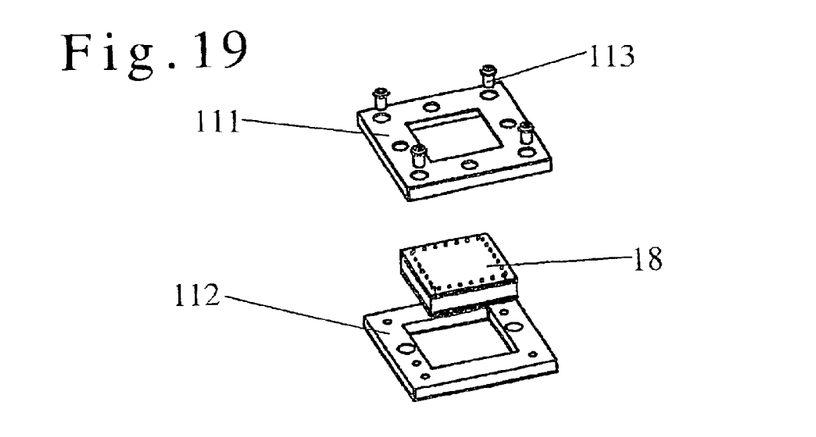
FIG. 19 is a perspective view of the probe pin assembly of the first embodiment, an upper lid and a lower lid that are to sandwich this probe pin assembly.
Figure 20:
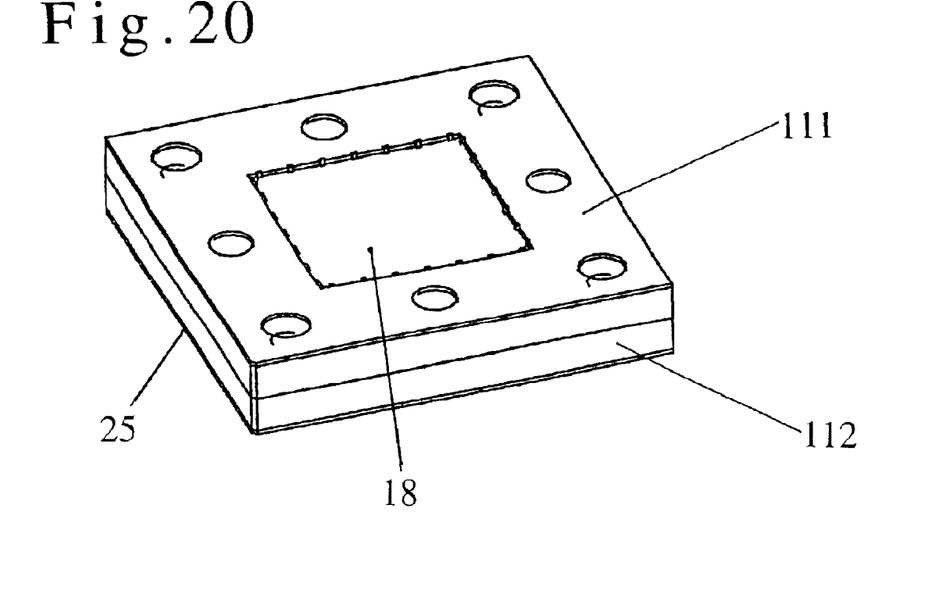
FIG. 20 is a perspective view of the probe pin assembly of the first embodiment that has been accommodated between the upper lid and lower lid.
Figure 21:
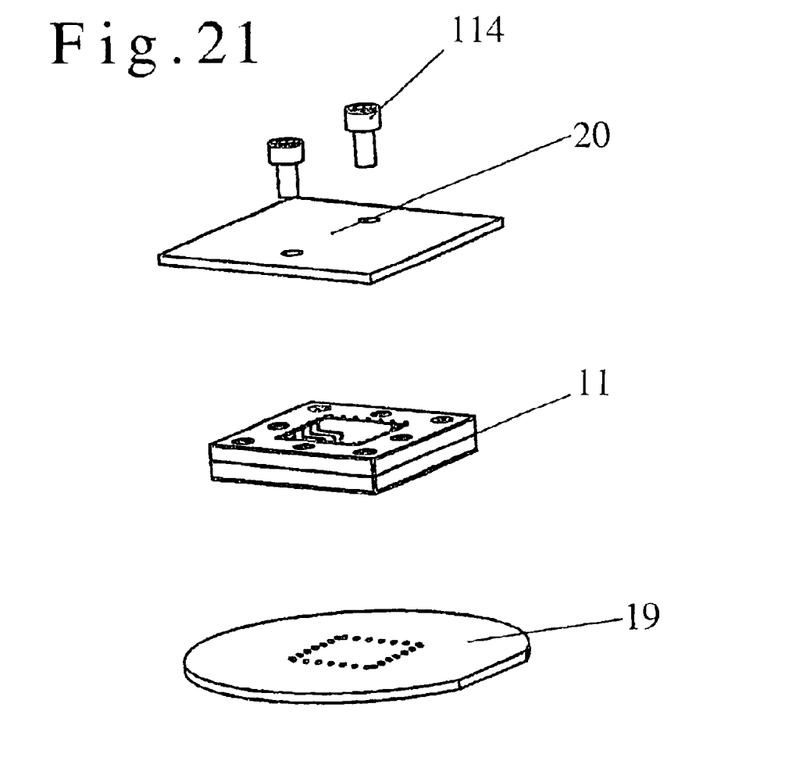
FIG. 21 is a perspective view illustrating how the probe pin assembly of the first embodiment is accommodated between the upper lid and lower lid and coupled with the circuit.

This primary probe pin assembly 18 is housed and held by a holder case 25. Referring to FIG. 19, the holder case 25 comprises an upper lid 111, lower lid 112, and four screws 113 that couple the upper and lower lids 111, 112 so that they are opposed to each other. The upper lid 111 and the lower lid 112 each have a rectangular hole close to the center to accommodate the primary probe pin assembly 18. The opening on the bottom face of the upper lid 111 is large enough to accept the primary probe pin assembly 18. However, the opening on its top face has inward eaves to make the top opening slightly smaller than either lateral or vertical dimension of the primary probe pin assembly 18, in order to hold the primary probe pin assembly 18 in it. Much like, the opening on the top face of the lower lid 112 is large enough to accept the primary probe pin assembly 18. However, the opening on its bottom face has inward eaves to make the bottom opening slightly smaller than either lateral or vertical dimension of the primary probe pin assembly 18, in order to hold the primary probe pin assembly 18 in it. Thanks to this lid structure, the primary probe pin assembly 18 is accommodated in the holder case 25, as shown in FIG. 20, with its top and bottom faces being held by the upper lid 111 and the lower lid 112. The upper lid 111 and the lower lid 112 restrict the vertical and lateral movements of the guides 184, 185 on the output and input sides. As shown in FIG. 21, the upper lid 111 of the probe pin assembly is fastened with screws 114 onto a circuit board 20. It becomes thereby possible to position the perpendicular-type probe pins 112, 212 of the probe pin assembly on the corresponding electrode pads on the circuit board 20 with high precision. Namely, all the output units 14 are electrically coupled with the corresponding electrode pads arranged in a rectangular line on the circuit board 20 used for testing. On the other hand, for electric continuity, the input units 13 are positioned on the corresponding electrode pads arranged in a rectangular line on the wafer 19 by a positioning means of an automatic system. In this manner, all the perpendicular-type probe pins 112, 212 of the lateral array of parallel probe pins 121 and the vertical array of parallel probe pins 122 fit within the limited space just above each region surrounded by a rectangular line of electrode pads on the wafer 19, occupying difference spaces in the vertical direction.

According to the first embodiment, the lateral array of parallel probe pins 121 of the first perpendicular-type probe pins 112 and the vertical array of parallel probe pins 122 of the second perpendicular-type probe pins 212 are arranged to cross at right angles, in the manner described above. Then it becomes possible to place the deformation unit 15 away from the points of force application of the input unit 13 and the output unit 14 of the perpendicular-type probe pins 112, 212 in a limited space. At the same time, it becomes possible to fit both lateral array of parallel probe pins 121 and vertical array of parallel probe pins 122 within the region of each chip on the LSI wafer which is the target for electric continuity, when the whole system is seen projected on a plane. In other words, the electric continuity with the electrode pads densely populated in one line is effectively attained with perpendicular-type probe pins having a large deformation margin, within a projected region corresponding to one chip.

(Embodiment 2)

FIGS. 22–27 illustrate a second embodiment of the present invention. The second embodiment is the case in which electrode pads are arranged in a staggered pattern.

Figure 22:
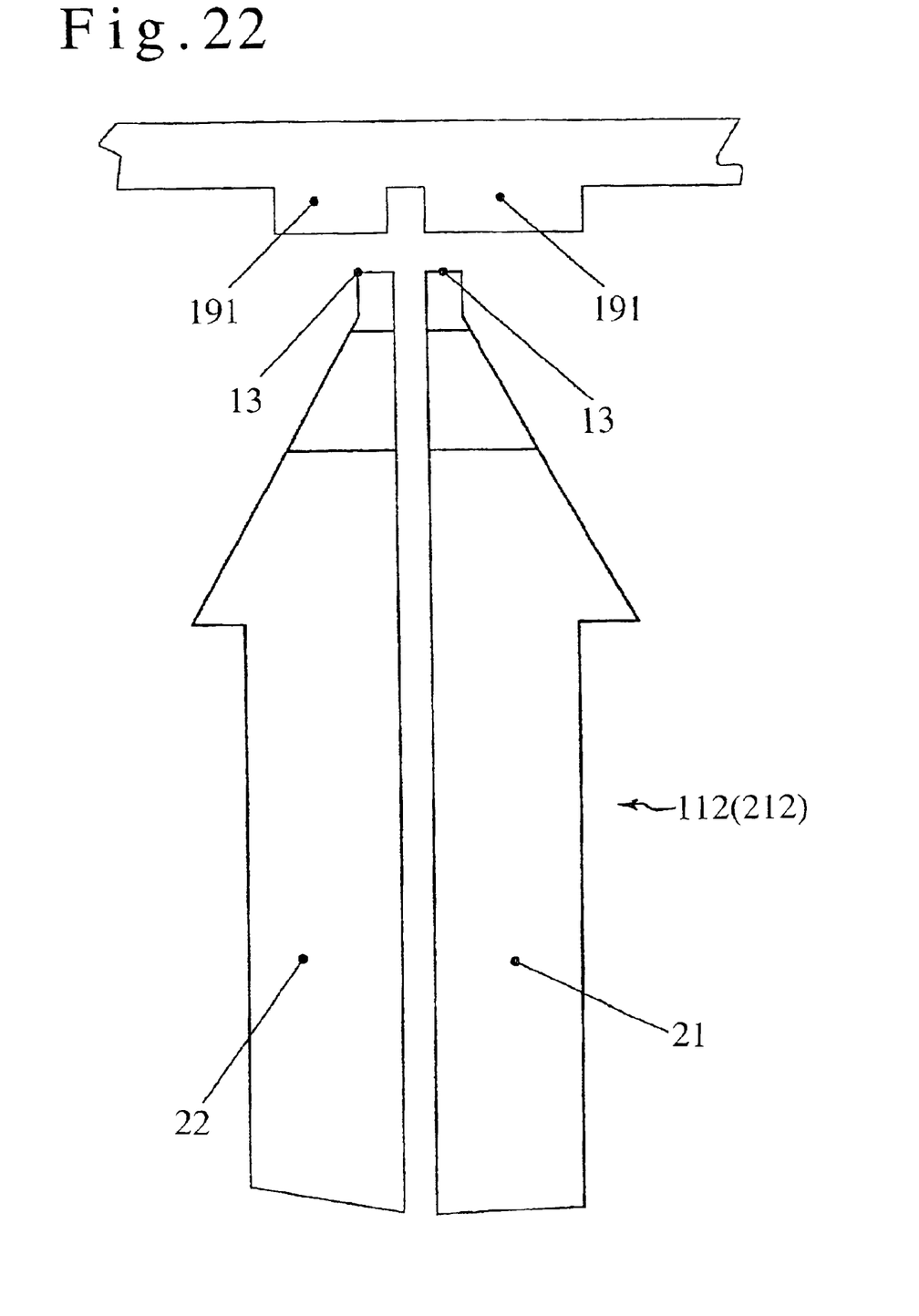
FIG. 22 is an enlarged partial front view of a perpendicular-type probe pin of a second embodiment of the invention.
Figure 23:
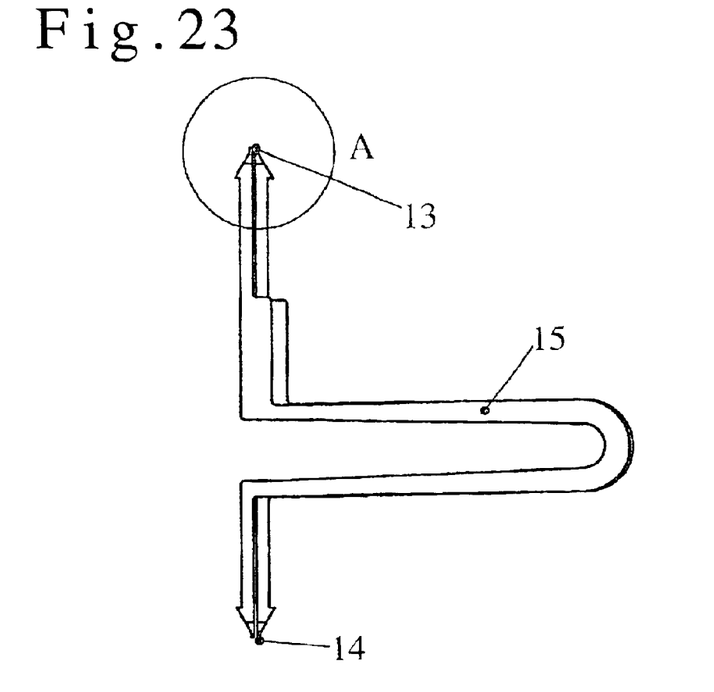
FIG. 23 is a perspective view of the whole perpendicular-type probe pin of the second embodiment.
Figure 24:
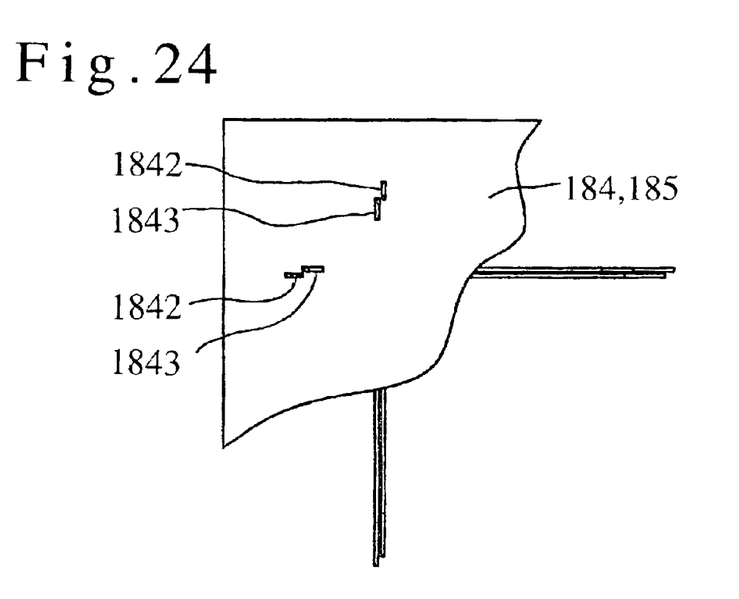
FIG. 24 is a partial plan view of a guide used in the perpendicular-type probe pin of the second embodiment.
Figure 25:
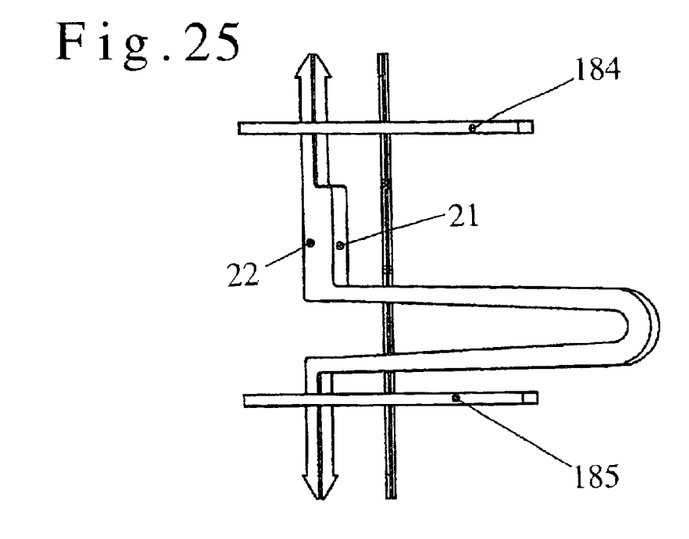
FIG. 25 is a front view illustrating the structure of the intersection of the perpendicular-type probe pins of the second embodiment.

In FIG. 22, each of the first and second perpendicular-type probe pins 112, 212 is composed of a pair of an outer probe pin 22 and an inner probe pin 21, opposed to the electrode pad 191. Namely, the input unit 13 and the beam extending from the output unit 14 to the deformation unit 15 of the perpendicular-type probe pin 112 (212) opposing the outer electrode pad 191 in the staggered pattern is directed to the outer electrode pad 191 arranged on a rectangular line, while the input unit 13 and the beam extending from the output unit 14 to the deformation unit 15 of the perpendicular-type probe pin 112 (212) opposing the inner electrode pad 191 in the staggered pattern is directed to the inner electrode pad 191 arranged on a rectangular line. As shown in FIG. 23, the principle structures of the input unit 13, output unit 14 and deformation unit 15 are the same as those described in the first embodiment. Meanwhile, as shown in FIG. 24, the output side guide 184 and the input side guide 185 each have an outer guide hole 1842 corresponding to the outer electrode pad in the staggered pattern and an inner guide hole 1843 corresponding to the inner electrode pad. As shown in FIGS. 25 and 26, the lateral array of parallel probe pins 121 and vertical array of parallel probe pins 122 occupy different spaces all together above the region of each chip under test.

This configuration provides the effects similar to those attained by the first embodiment. As demonstrated in FIG. 27, the guide holes 1842, 1843 are larger than the electrode pad in most cases. Thus the distance, d, between the guide holes 1842 and 1843 becomes small and thus the holes are likely to overlap each other. In order to solve this problem, in the second embodiment, the vertical portion of the outer probe pin is inserted in the guides 184, 185 from the outer side, while the inner probe pin 21 is inserted in the guides 184, 185 from the inner side.

While the invention has been particularly shown and described with reference to preferred embodiments thereof, it will be understood by those skilled in the art that foregoing and other modifications in form and details may be made therein without departing from the spirit and scope of the invention. Such modifications are therefore included in this invention.

What is claimed is:

1. A probe pin assembly comprising:
   a lateral array of parallel probe pins arrayed in a lateral direction to contact a plurality of electrode pads arranged in a vicinity of a lateral edge of a chip under test, each pin having an input unit on one end for contacting the electrode pad of said chip, an output unit on the other end for contacting a circuit terminal, and a deformation unit of a beam structure between the input unit and the output unit; and
   a vertical array of parallel probe pins arrayed in a vertical direction to contact a plurality of electrode pads arranged in a vicinity of a vertical edge of a chip under test, each of the latter pins having an input unit on one end for contacting the electrode pad of said chip, an output unit on the other end for contacting a circuit terminal, and a deformation unit of a beam structure between the input unit and the output unit;
   wherein said lateral array of parallel probe pins and vertical array of parallel probe pins extend above a region of the chip under test such that the deformation units thereof are directed inwardly of the region of the chip, and at least one of the deformation units of the lateral array of parallel probe pins extends in a first plane and overlaps with at least one of the deformation units of the vertical array of parallel probe pins in a direction perpendicular to a chip surface, the at least one of the deformation units of the vertical array of parallel probe pins extending in a second plane that intersects with the first plane.

2. The probe pin assembly according to claim 1, wherein said input unit and output unit are substantially aligned on a common perpendicular line while said deformation unit is formed into a curve between said input unit and output unit.

3. The probe pin assembly according to claim 1, wherein each of said perpendicular-type probe pin is composed of a pair of outer and inner probe pins to correspond to the electrode pads arranged in a staggered pattern.

4. The probe pin assembly according to claim 1, further comprising at least one guide for guiding said perpendicular-type probe pins to the electrode pad of the chip under test and the circuit terminals, the at least one guide being installed between said input unit and deformation unit and between said output unit and deformation unit.

5. The probe pin assembly according to claim 4, wherein said guide has a substantially rectangular hole having at least one notch for guiding said perpendicular-type probe pin.

6. The probe pin assembly according to claim 4, wherein said guide is made of a thin, flexible film or sheet.

7. The probe pin assembly according to claim 4, wherein said guide has a multi-layered structure.

8. The probe pin assembly according to claim 4, further comprising means for holding a plurality of guides in parallel.

9. The probe pin assembly according to claim 8, wherein said means for holding the guides in parallel is a hollow frame.

10. The probe pin assembly according to claim 4, further comprising means for restricting vertical movement of the at least one guide and an upper lid and a lower lid for restricting lateral movement of the at least one guide.

11. The probe pin assembly according to claim 9, further comprising means for restricting vertical movement of the at least one guide and an upper lid and a lower lid for restricting lateral movement of the at least one guide.

12. The probe pin assembly according to claim 4, wherein either the upper or lower lid is coupled with an immobile substrate.

13. The probe pin assembly according to claim 10, wherein either the upper or lower lid is coupled with an immobile substrate.

14. A probe pin assembly, comprising:
a first array of probe pins, each probe pin having an input end, an output end, and a deformation section of a beam structure disposed between the input end and the output end; and
a second array of probe pins positioned substantially perpendicular to the first array of probe pins, each of the latter probe pins having an input end, an output end, and a deformation section of a beam structure disposed between the input end and the output end;
wherein the first array of probe pins and the second array of probe pins are located above a region of a chip under test in a manner that the deformation units of the probe pins of both of the first array of probe pins and the second array of probe pins are directed inwardly of the region of the chip; and
wherein at least one deformation section of the first array of probe pins extends in a first plane and overlaps with at least one deformation section of the second array of probe pins in a direction perpendicular to a chip surface, the at least one deformation section of the second array of probe pins extending in a second plane that intersects with the first plane.

15. The probe pin assembly of claim 14 wherein the second plane is substantially perpendicular to the first plane.

* * * * *